US006473873B1

(12) United States Patent
Akamatsu et al.

(10) Patent No.: US 6,473,873 B1
(45) Date of Patent: Oct. 29, 2002

(54) SEMICONDUCTOR MEMORY DEVICE

(75) Inventors: Hironori Akamatsu, Hirakata (JP); Toru Iwata, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/206,534

(22) Filed: Dec. 7, 1998

(30) Foreign Application Priority Data

Dec. 9, 1997 (JP) .............................................. 9-339128

(51) Int. Cl.[7] .............................................. G06F 11/00
(52) U.S. Cl. ..................................................... 714/738
(58) Field of Search ............................... 714/718–719, 714/738, 733, 736, 700, 743; 345/507, 519; 375/239; 365/194, 201, 230.08; 711/220; 712/17, 16

(56) References Cited

U.S. PATENT DOCUMENTS 5,481,671 A * 1/1996 Fujisaki ....................... 365/201
6,101,620 A * 8/2000 Ranganathan ................ 714/718

OTHER PUBLICATIONS

Mori et al. (A 45ns 64Mb DRAM with a Merged Match–line Test Architecture; IEEE; Mar., 1991).*
Liu et al. (Application of Microprocessors in a Multi–processor System; IEEE; Mar. 1997).*
Raghunathan et al. (Test Generation for Cyclic Combinational Circuits; IEEE; Jan. 1994).*
Sen–Chung et al. (LDS–ATPG: An Automatic Test Pattern Generation System for Combinational VLSI Circuits; IEEE; May 1989).*
Kohno et al. (A 14–ns 1–Mbit CMOS SRAM with Variable Bit Organization; IEEE; Oct. 1988).*
Anami et al. (An Asymmetric Memory Cell Using a C–TFT for ULSI SRAMs; IEEE; Jun. 1992).*
Chih–Chang et al. (Time–Multiplexed Routing Resources for FPGA Design; IEEE; May 1996).*
Self–Test/Connection Technique for Wafer Scale Integration Memory; IBM Technical Disclosure, Bulletin, Sep. 1985, US; NN85091733.*
S. Mori et al., 1991 IEEE ISSCC, pp. 110–111, 1991, "A 45ns 64Mb DRAM with a Merged Match–Line Test Architecture".

* cited by examiner

Primary Examiner—Albert Decady
Assistant Examiner—Guy Lamar Re
(74) Attorney, Agent, or Firm—Renner, Otto, Boisselle & Sklar

(57) ABSTRACT

A semiconductor memory device includes: a memory block including a plurality of memory cells; and a test pattern generation circuit for generating at least one test pattern for use in testing the memory block. A first bus line for coupling the memory block and the test pattern generation circuit has a larger width than that of a second bus line for coupling the memory block to the exterior of the semiconductor memory device.

5 Claims, 14 Drawing Sheets

SEMICONDUCTOR MEMORY DEVICE

BACKGROUND OF THE INVENTION

1. Field of the Invention

The invention generally relates to semiconductor memory devices, and in particular large-capacity semiconductor memory devices incorporating microelements.

2. Description of the Related Art

The recent development in semiconductor technologies has enabled the capacity of DRAMs to increase fourfold every three years. The market supply of 16 Mbit DRAMs has practically reached its peak, and 64 Mbit DRAMs have begun to become available on the market. On the research and development end, 256 Mbit to 1 Gbit DRAMs are under development.

Irrespective of the capacity of DRAMs, it is essential to subject them to tests for distinguishing those which are satisfactory from those which are defective.

Among others, the following problems (i) and (ii) need to be solved in connection with such testing of large capacity DRAMs:

i) Reduction in test mode time

More time will be required for the test mode operation as the storage capacity of DRAMs increases. However, it is preferable to minimize the test mode time.

ii) Improvement in test accuracy

As a method for testing DRAMs, for example, a so-called parallel test has been proposed (see "92.9 HITACHI IC MEMORY DATABOOK p. 639, Internal 16 bit parallel testing function"; "PARALLEL TESTING TECHNIQUES SUITABLE FOR SUPER LARGE CAPACITY MEMORIES, Matsumura et al., ICD87-75 pp. 41–46"; and "A 45 ns 64 Mb DRAM WITH A MERGED MATCH-LINE TEST ARCHITECTURE, Shigeru, Mori., et al., 1991 IEEE ISSCC pp. 110–111").

In a parallel test, for example, the same data is written to a plurality of memory cells which are coupled to the same word line in a DRAM so as to examine whether or not all of the values output from a plurality of bit lines corresponding to the memory cells are the same. Such a test may be performed by supplying the values output from the plurality of bit lines to EXOR circuits, for example. However, this technique has a problem in that, assuming that data "1" is written to the plurality of memory cells coupled to the same word line, if all the memory cells output "0", the EXOR circuits will erroneously determine such a DRAM as satisfactory.

Thus, a parallel test may be utilized as a screening test, but does not provide sufficient accuracy.

SUMMARY OF THE INVENTION

A semiconductor memory device according to the present invention includes: a memory block including a plurality of memory cells; and a test pattern generation circuit for generating at least one test pattern for use in testing the memory block, wherein a first bus line for coupling the memory block and the test pattern generation circuit has a larger width than that of a second bus line for coupling the memory block to the exterior of the semiconductor memory device.

In one embodiment of the invention, the test pattern generation circuit includes a storage section for storing a plurality of test patterns, and one of the plurality of test patterns is output in accordance with an address signal received by the test pattern generation circuit.

In another embodiment of the invention, the semiconductor memory device includes a comparison circuit for comparing a test pattern which is read from the memory block against a test pattern which is generated by the test pattern generation circuit.

In still another embodiment of the invention, the semiconductor memory device includes a switching circuit for selectively outputting the test pattern which is generated by the test pattern generation circuit to one of the memory block and the comparison circuit.

In still another embodiment of the invention, the semiconductor memory device includes a plurality of terminals for inputting data to and outputting data from the memory block, and the test pattern generation circuit generates a plurality of test patterns in accordance with the address signal received by the test pattern generation circuit, the address signal being received via the plurality of terminals.

In still another embodiment of the invention, the semiconductor memory device includes a plurality of terminals for inputting data to or outputting data from the memory block, and at least one of the plurality of terminals outputs a result by the comparison circuit comparing the test pattern which is read from the memory block against the test pattern which is generated by the test pattern generation circuit.

Thus, according to the present invention, in a test mode for testing a memory block provided on a chip, a test pattern which is generated by a test pattern generation circuit provided on the same chip is written to the memory block via first bus lines having a larger width of the first bus lines than that of second bus lines. Such writing via the first bus lines occurs much faster than writing an externally-supplied test pattern to the memory block via second bus lines.

By recording a plurality of test patterns in a storage section, it becomes possible to output a different test pattern from the test pattern generation circuit depending on an address signal. This makes it possible to subject the memory block to various kinds of tests.

Furthermore, a test pattern which has been generated by a test pattern generation circuit can be once stored in and then read from a memory block. Then, the comparison circuit compares the test pattern which has been read from the memory block against a test pattern which has been generated by the test pattern generation circuit. As a result, it is possible to accurately detect whether a plurality of memory cells included in the memory block are satisfactory or defective.

A plurality of terminals can be utilized both for data input/output to or from the plurality of memory cells of the memory block and for receiving an address signal which is needed by the test pattern generation circuit to generate a test pattern. As a result, the semiconductor memory device can advantageously have a reduced number of terminals as compared to those required in a configuration where terminals for receiving an address signal are separately incorporated in addition to terminals for data input/output.

A plurality of terminals can be utilized for data input/output to or from the memory block, one of which terminals can be further utilized for outputting a comparison result by the comparison circuit. As a result, the semiconductor memory device can advantageously have a reduced number of terminals as compared to those required in a configuration where a terminal for outputting a comparison result by the comparison circuit is separately incorporated in addition to terminals for data input/output.

Thus, the invention described herein makes possible the advantage of, in a test mode for testing a semiconductor memory device, reducing the test mode time while improving the accuracy of the test.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying figures.

EXAMPLE 1

Figure 1:
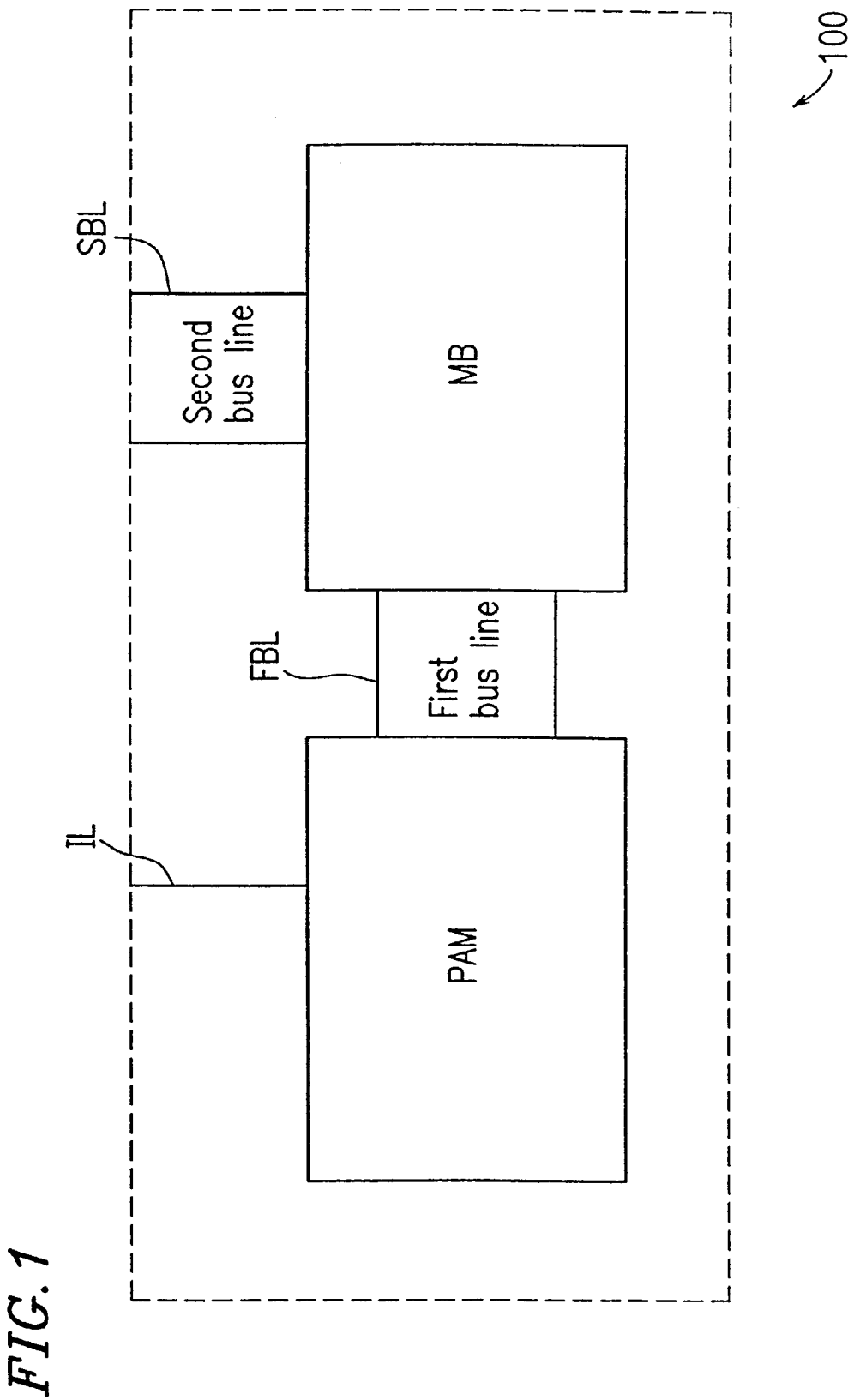
FIG. 1 is a block diagram illustrating a semiconductor memory device 100 according to Example 1 of the present invention.

FIG. 1 is a block diagram illustrating a semiconductor memory device 100 according to Example 1 of the present invention.

The semiconductor memory device 100 includes a memory block MB (which in turn includes a plurality of memory cells), a test pattern generation circuit PAM for generating at least one test pattern for use in testing the memory block MB. These two elements are constructed on a single chip.

The test pattern generation circuit PAM is coupled to the memory block MB via first bus lines FBL. The memory block MB is coupled to the exterior of the semiconductor memory device 100 via second bus lines SBL. The first bus lines FBL have a larger bus width than that of the second bus lines SBL. For example, the first bus lines FBL have a bus width of 64 bits, whereas the second bus lines SBL have a bus width of 8 bits.

A test pattern which is generated by the test pattern generation circuit PAM is written to the memory block MB via the first bus lines FBL. As a result, the semiconductor memory device 100 is capable of writing such a test pattern to the memory block MB faster than writing an externally-supplied test pattern to the memory block MB via the second bus lines SBL, which have a smaller bus width than that of the first bus lines FBL.

The test pattern generation circuit PAM generates at least one test pattern for use in testing the memory block MB based on a signal which is supplied from outside the semiconductor memory device 100, e.g., an address signal.

For example, the test pattern generation circuit PAM may include a storage section (not shown) for storing a plurality of test patterns, and output at least one test pattern in accordance with a signal (e.g., an address signal) which is supplied from outside the semiconductor memory device 100 via an input line IL. Such a test pattern generation circuit PAM is capable of outputting a different test pattern, from among the plurality of test patterns stored in the storage section, depending on the given address signal.

Alternatively, the test pattern generation circuit PAM may include a pseudo random numbers generator (not shown) and generate at least one test pattern based on a signal which is supplied from outside the semiconductor memory device 100 via the input line IL. Such a test pattern generation circuit PAM is capable of applying different tests to the memory block MB by using a plurality of test patterns generated by the pseudo random numbers generator.

As described above, the test pattern generation circuit PAM is capable of performing a number of tests for the memory block MB, thereby resulting in improved test accuracy.

The line width of the input line IL may be one bit or more.

EXAMPLE 2

Figure 2:
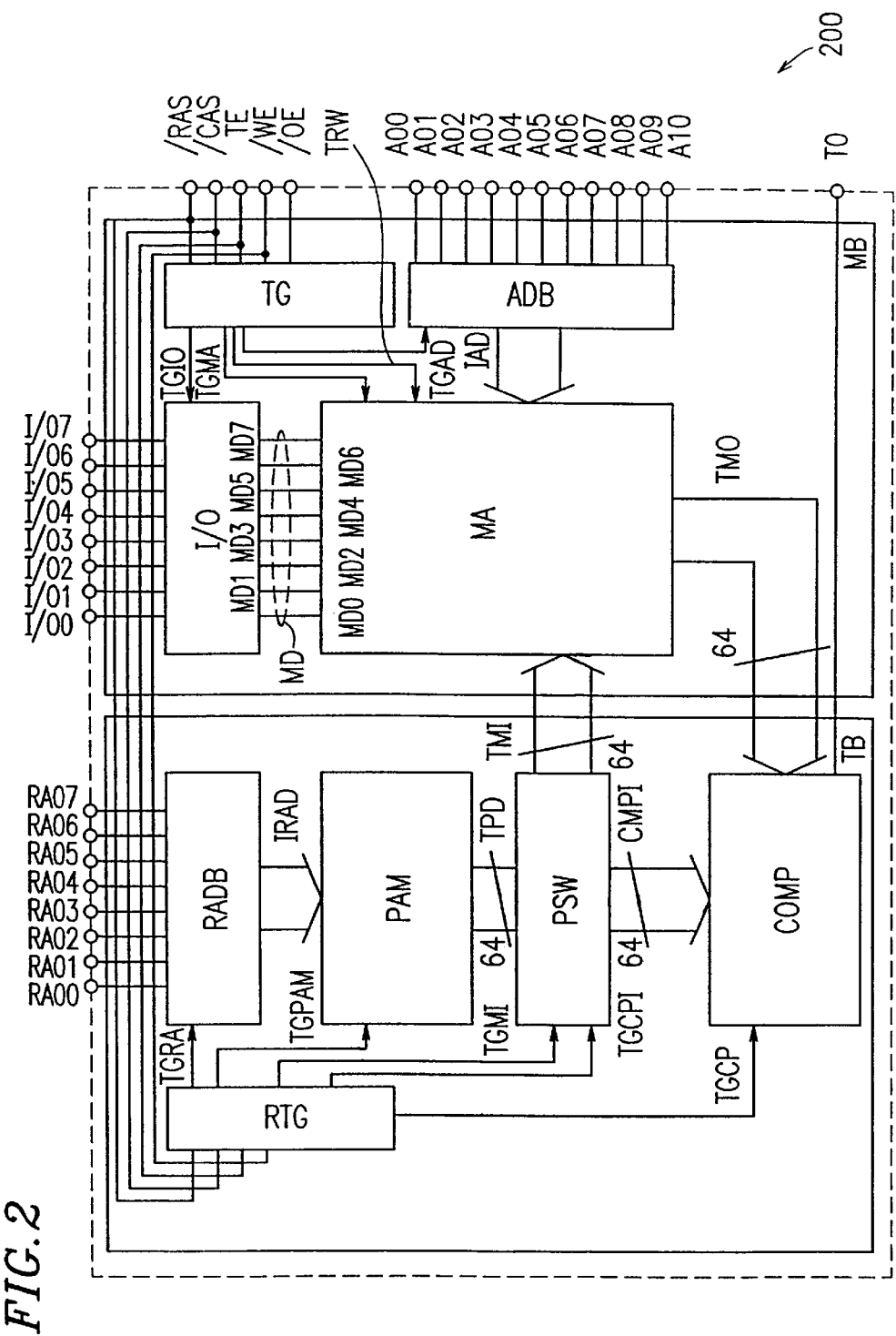
FIG. 2 is a block diagram illustrating a semiconductor memory device 200 according to Example 2 of the present invention.

FIG. 2 is a block diagram illustrating a semiconductor memory device 200 according to Example 2 of the present invention.

The semiconductor memory device 200 includes a memory array MA, a test pattern generation circuit PAM for generating at least one test pattern for use in testing the memory array MA, and a comparison circuit COMP for comparing a test pattern which has been once stored in and then read from the memory array MA against a test pattern which has been generated by the test pattern generation circuit PAM. These three elements are constructed on a single chip.

Since the comparison circuit COMP compares a test pattern which has been once stored in and then read from the memory array MA against a test pattern which has been generated by the test pattern generation circuit PAM, it is possible to accurately detect whether a plurality of memory cells in the memory array MA are satisfactory or defective.

The semiconductor memory device 200 includes a switching circuit PSW which can selectively output a test pattern generated by the test pattern generation circuit PAM to either the memory array MA or the comparison circuit COMP.

Hereinafter, the structure of the semiconductor memory device 200 will be described in more detail.

The semiconductor memory device 200 includes: an address input circuit ADB via which an address signal is input to the memory array MA; a data input/output circuit I/O via which data is input to or output from the memory array MA; a timing generation circuit TG; an address input circuit RADB via which an address signal is input to the test pattern generation circuit PAM; and a timing generation circuit RTG.

The timing generation circuit TG receives a row address strobe signal /RAS, a column address strobe signal /CAS, a test enable signal TE, a write enable signal /WE, and an output enable signal /OE. In accordance with these signals, the timing generation circuit TG generates at least one of a control signal TGMA for controlling the timing with which to input data to or output data from the memory array MA, a control signal TGIO for controlling the data input/output circuit I/O, a control signal TGAD for controlling the address input circuit ADB, and a control signal TRW for controlling the writing or reading of data.

The timing generation circuit RTG receives the row address strobe signal /RAS, the column address strobe signal /CAS, the test enable signal TE, and the write enable signal /WE. In accordance with these signals, the timing generation circuit RTG generates at least one of a control signal TGPAM for controlling the timing with which the test pattern generation circuit PAM generates a test pattern, a control signal TGRA for controlling the address input circuit RADB, a control signal TGCP for controlling the comparison circuit COMP, and control signals TGMI and TGCPI.

The memory array MA is coupled to the address input circuit ADB via an internal address bus IAD. The address input circuit ADB includes address terminals A00 to A10. The memory array MA receives an address signal which has been input via the address terminals A00 to A10.

The memory array MA is coupled to the data input/output circuit I/O via an internal data bus MD. The data input/output circuit I/O includes data input/output terminals I/O0 to I/O7 for exchanging data between the data input/output circuit I/O and the exterior of the semiconductor memory device 200 (note that the semiconductor memory device 200 and the data input/output circuit I/O are constructed on a single chip). The memory array MA is coupled to the comparison circuit COMP via a test pattern output bus TMO.

The test pattern generation circuit PAM is coupled to the address input circuit RADB via an internal address bus IRAD. The address input circuit RADB includes address terminals RA00 to RA07. The test pattern generation circuit PAM receives an address signal which has been input via the address terminals RA00 to RA07. The test pattern generation circuit PAM generates at least one test pattern in accordance with the received address signal. The generated test pattern is output to the switching circuit PSW via an internal bus TPD.

The switching circuit PSW is coupled to the memory array MA via an internal bus TMI, and coupled to the comparison circuit COMP via an internal bus CMPI. The switching circuit PSW receives the control signal TGMI or TGCPI, and selectively outputs the test pattern generated by the test pattern generation circuit PAM to either the memory array MA or the comparison circuit COMP, in accordance with the control signal TGMI or TGCPI.

The comparison circuit COMP compares the test pattern which has been read from the memory array MA against the test pattern which has been generated by the test pattern generation circuit PAM. The result of comparison is output via an output terminal TO.

A region (denoted as TB) of the chip is called a test circuit block, whereas another region (denoted as MB) of the chip is called a memory block. The memory block MB may be implemented as a memory block of a commonly employed semiconductor memory device or an equivalent thereof. The memory block MB includes the memory array MA, the address input circuit ADB, the data input/output circuit I/O, the timing generation circuit TG, and elements associated therewith. The test circuit block TB includes the test pattern generation circuit PAM, the comparison circuit COMP, and elements associated therewith.

Hereinafter, the operation of the semiconductor memory device 200 will be described.

In a test mode, the test pattern which has been generated by the test pattern generation circuit PAM (which is part of the test circuit block TB) is written to the memory array MA (which is part of the memory block MB) at the address designated by the address signal which has been input via the address terminals A00 to A10 of the address input circuit ADB.

The test pattern generation circuit PAM stores the test patterns in corresponding relationships with respectively unique addresses. When an address is externally input via the address terminals RA00 to RA07 of the address input circuit RADB, a test pattern which corresponds to the received address signal is generated.

The switching circuit PSW preferably transfers the generated test pattern to the memory array MA before the transfer of the test pattern to the comparison circuit COMP.

The test pattern which has been written to the memory array MA is read therefrom, and the same test pattern as that which has been written to the memory array MA is generated by the test pattern generation circuit PAM. In the case where the switching circuit PSW is storing the test pattern, it is unnecessary for the test pattern generation circuit PAM to generate the same test pattern again.

The comparison circuit COMP compares the test pattern read from the memory array MA and the test pattern from the test pattern generation circuit PAM. If these test patterns are identical, the comparison circuit COMP outputs a signal indicating that the semiconductor memory device 200 is satisfactory at the output terminal TO; if these test patterns are not identical, the comparison circuit COMP outputs a signal indicating that the semiconductor memory device 200 is defective at the output terminal TO.

As described above, the semiconductor memory device 200 is capable of simultaneously inputting 8 bit data via the data input/output terminals I/O0 to I/O7 to the memory array MA.

Even by utilizing the data input/output terminals I/O0 to I/O7 to simultaneously input an 8 bit test pattern, this only allows eight memory cells to be simultaneously tested.

On the other hand, by inputting an 8 bit address signal via the address terminals RA00 to RA07, the test pattern generation circuit PAM can generate, for example, a 64 bit test pattern based on the 8 bit address signal. Thus, the number of bits of the test pattern generated by the test pattern generation circuit PAM is always larger than the number of bits of the data which the memory array MA receives via the data input/output terminals I/O0 to I/O7.

By generating a 64 bit test pattern, it becomes possible to simultaneously test 64 memory cells.

Since the test pattern generation circuit PAM is capable of selectively generating a test pattern in accordance with an external address signal, it is possible to generate a plurality of test patterns in a predetermined order. For example, if an 8 bit address signal is input, the test pattern generation circuit PAM can generate $2^8$ test patterns. Thus, the semiconductor memory device 200 can provide various kinds of test patterns, such test patterns being generated in an order which can be arbitrarily selected with much freedom, thereby allowing for more accurate testing.

Hereinafter, specific examples of the test pattern generation circuit PAM will be illustrated with reference to FIGS. 3 and 4.

Figure 3:
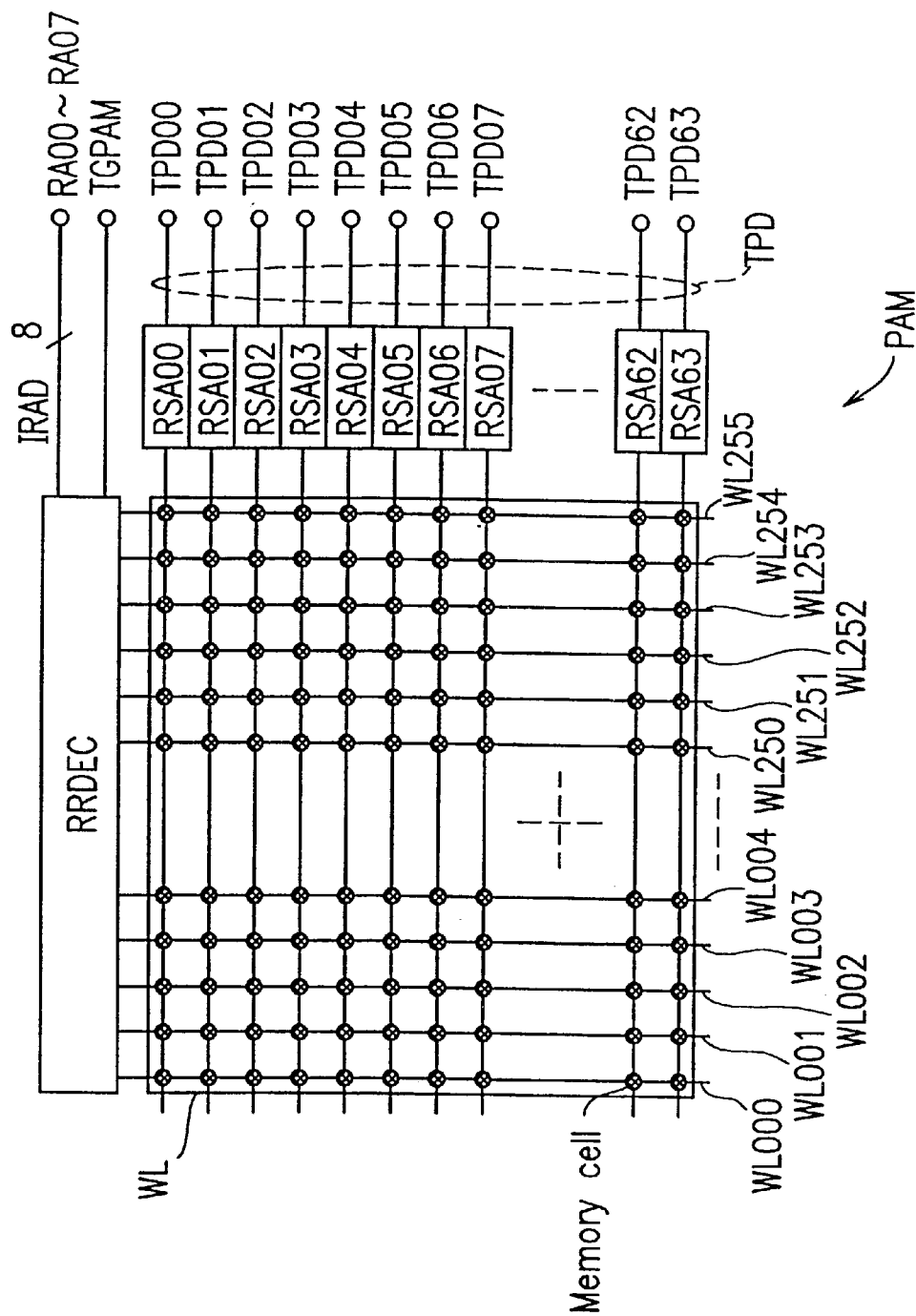
FIG. 3 shows an exemplary structure of a test pattern generation circuit PAM.

FIG. 3 shows an exemplary structure of the test pattern generation circuit PAM.

The test pattern generation circuit PAM shown in FIG. 3 includes a memory section WL (including a matrix of word lines WL000 to WL255), a row decoder circuit RRDEC, sense amplifier/output circuits RSA00 to RSA63, and output terminals TPD00 to TPD63 for outputting test patterns.

As described above, an 8 bit address signal is input via the address terminals RA00 to RA07 of the test circuit block TB, so that the test pattern generation circuit PAM can generate $2^8=256$ kinds of test patterns. The test pattern generation circuit PAM includes 256 word lines so as to allow the generation of 256 kinds of test patterns.

Memory cells equivalent to 64 bits are provided per each word line. As a result, the test pattern generation circuit PAM is capable of simultaneously outputting a 64 bit test pattern in parallel.

When an 8 bit address signal is input via the address terminals RA00 to RA07 of the test circuit block TB, the address signal is input to the row decoder circuit RRDEC. Responsive to the control signal TGPAM from the timing generation circuit RTG, the row decoder circuit RRDEC selects and activates a word line that corresponds to the address signal. The memory cells which are coupled to the selected word line respectively output the data stored therein. The data output from the memory cells coupled to the selected word line is amplified by the sense amplifier/output circuits RSA00 to RSA63. Thereafter, the amplified data is output to the switching circuit PSW via the internal bus TPD (output terminals TPD00 to TPD63).

The memory section WL may be implemented as any type of memory. A ROM type is preferable and assumed in FIG. 3 because it can retain the stored data after termination of power.

If it is desirable to rewrite the test pattern which is stored in the memory section WL, the memory section WL can be implemented as an EEPROM or an SRAM. However, in the case of employing an EEPROM, a voltage step-up circuit may be required and the process of data storage may be complicated; in the case of employing an SRAM, it is impossible to retain the stored data after termination of power. Such aspects of EEPROMs or SRAMs should also be taken into account when employing them in the memory section WL.

Hereinafter, a test pattern generation circuit PAM in the case where the memory section WL is implemented as an EEPROM or an SRAM will be illustrated with reference to FIG. 4.

Figure 4:
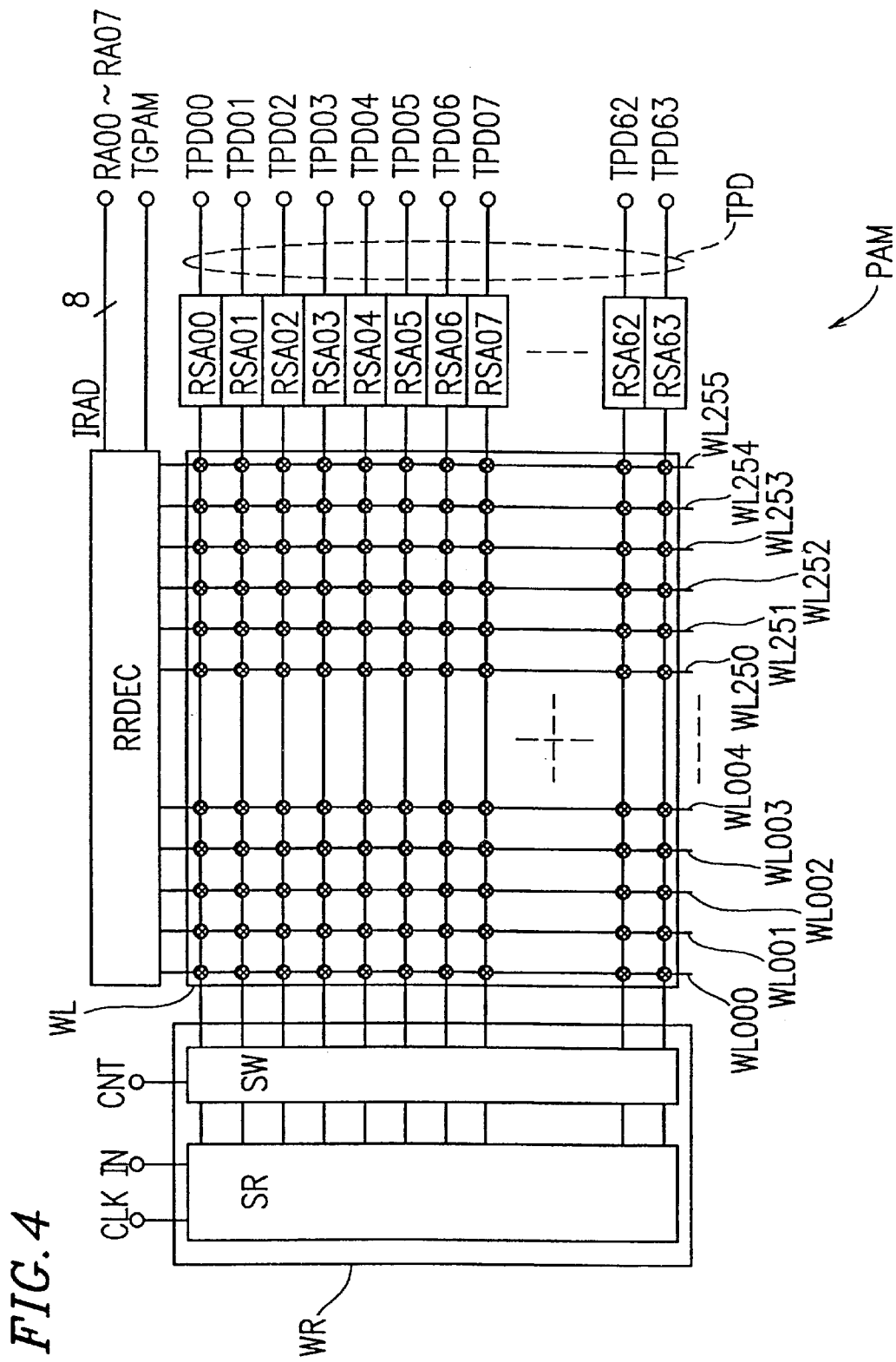
FIG. 4 shows an exemplary structure of a test pattern generation circuit PAM which allows for rewriting of test patterns.

FIG. 4 shows an exemplary structure of the test pattern generation circuit PAM which allows for rewriting of test patterns.

The test pattern generation circuit PAM shown in FIG. 4 includes a write section WR (which in turn includes a 64 bit shift register circuit SR and a write switch SW) in addition to the elements employed in the test pattern generation circuit PAM shown in FIG. 3. The write section WR is constructed on the same chip as the semiconductor memory device 200.

The shift register circuit SR stores a 64 bit test pattern in synchronization with a control clock signal CLK. The serially-fed 64 bit test pattern is input via an input terminal IN.

Then, responsive to a write control signal CNT, the write switch SW outputs the 64 bit test pattern in the shift register circuit SR to the memory section WL in a parallel manner. The row decoder circuit RRDEC receives an address signal via the address terminals RA00 to RA07, and responsive to the control signal TGPAM from the timing generation circuit RTG, selects and activates word line in the memory section WL that corresponds to the address signal. The memory cells which are coupled to the selected word line store the 64 bit test pattern transferred from the shift register SR.

In accordance with the 8 bit address which is input to the row decoder circuit RRDEC, one of the 256 word lines is sequentially designated, so that a 64 bit test pattern is input from the shift register circuit SR every time a word line is designated. By this method, 256 kinds of test patterns can be stored in the memory section WL.

Thus, the test patterns in the test pattern generation circuit PAM can be easily rewritten. Such diversity in the test patterns makes for highly accurate testing.

In the case of employing the above-described shift register SR, a test pattern can be serially input and then output in parallel. Therefore, only one terminal is required for inputting test patterns. Thus, the use of the shift register SR does not complicate the external terminal arrangement of the semiconductor memory device 200.

The writing of test patterns to the shift register SR may be performed in any given procedure that allows a test pattern to be serially input to the shift register SR.

The above operation of writing test patterns may occur at any arbitrary point in time. In the case where it is acceptable to disclose the test mode to users, the test pattern may be written to the memory at the time of initializing any system incorporating the chip which carries the semiconductor memory device 200 (including the write section WR) mounted thereon because a user testing is generally performed at the time of system initialization.

Figure 5:
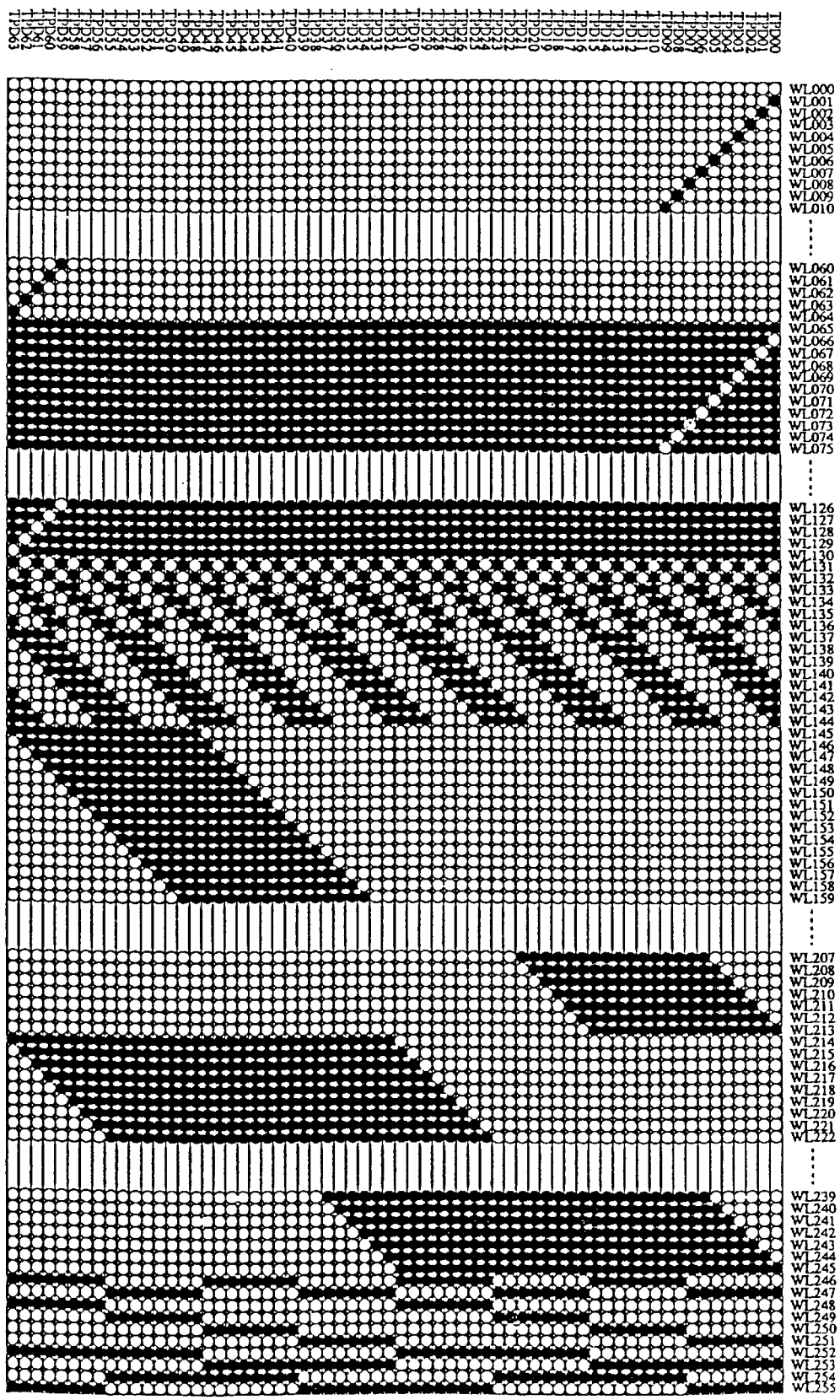
FIG. 5 shows an example of 256 kinds of test patterns which can be stored in a memory section WL shown in FIG. 3 or 4.

FIG. 5 shows an example of 256 kinds of test patterns which can be stored in the memory section WL in FIG. 3 or 4.

Since the memory section WL shown in FIG. 3 or 4 includes 256×64 memory cells and 256 word lines, it is capable of storing 256×64 values. A 64 bit test pattern is stored in the memory cells coupled to one word line.

In FIG. 5, each circle (○ or ●) corresponds to a memory cell. Each blank circle (○) represents an "L (low)" level, whereas each solid circle (●) represents an "H (high)" level. For example, the memory cells which are coupled to the word line WL000 are all at the "L" level, and the memory cells which are coupled to the word line WL065 are all at the "H" level.

When the word line WL000 is activated so that an "all-L" test pattern is output from the test pattern generation circuit PAM and output to the memory array MA via the switching circuit PSW, it is possible to write the "L" state to all of the memory cells within the memory array MA by sequentially changing the address for the memory array MA as designated by the address input circuit ADB.

Similarly, when the word line WL065 is activated so that an "all-H" test pattern is output from the test pattern generation circuit PAM and output to the memory array MA via the switching circuit PSW, it is possible to write the "H"

state to all of the memory cells within the memory array MA by sequentially changing the address for the memory array MA as designated by the address input circuit ADB.

Such overall erasure and overall writing may be employed in modes other than the test mode.

If more than 256 test patterns are necessary, the number of word lines can be increased accordingly. Note that any increase in the number of word lines should be complemented by a corresponding increase in the number of bits of the address signal and the number of address terminals.

Hereinafter, the structure of the memory array MA will be described with reference to FIGS. 6 to 8.

Figure 6:
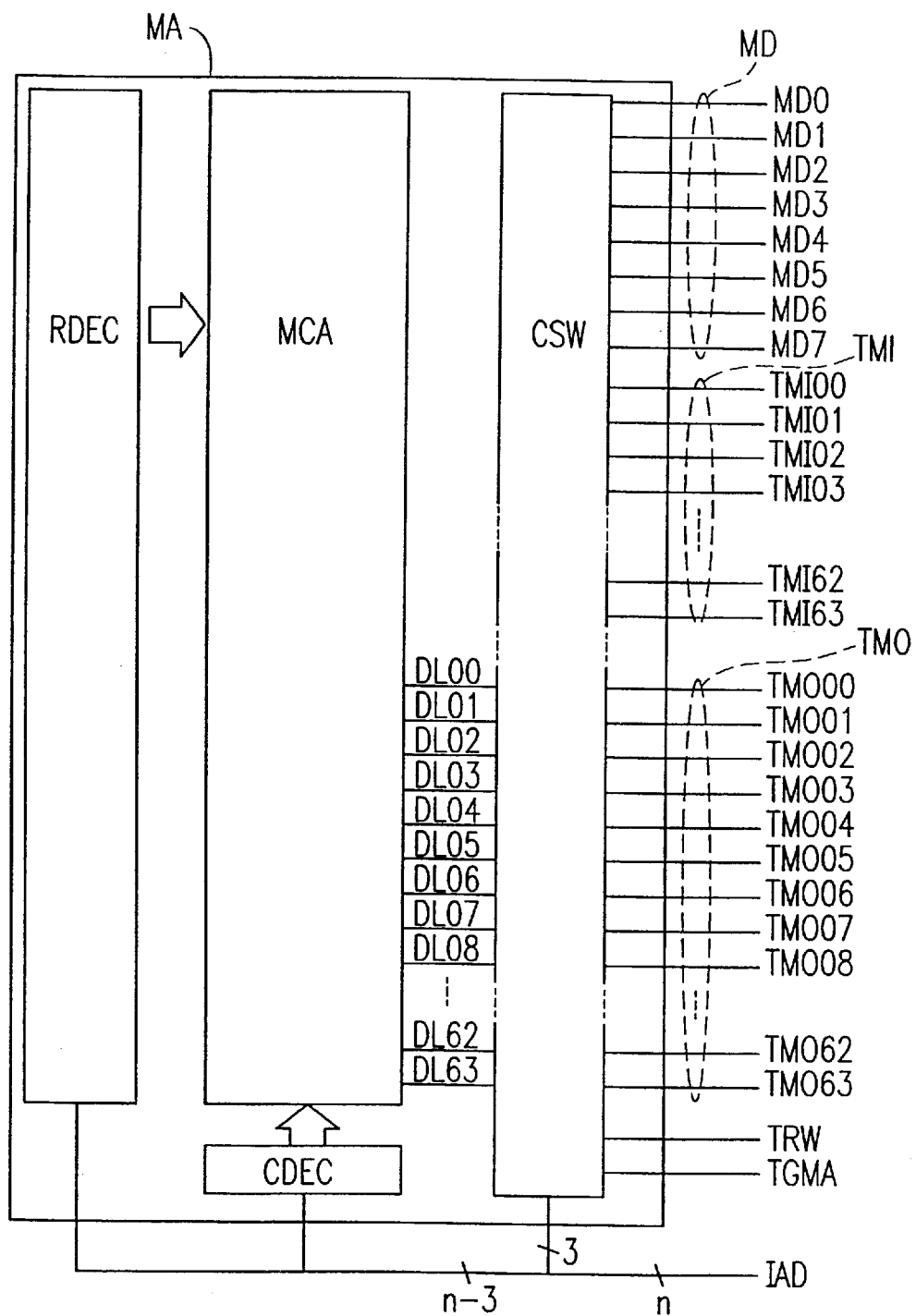
FIG. 6 shows an exemplary structure of a memory array MA.

FIG. 6 shows an exemplary structure of the memory array MA.

The memory array MA shown in FIG. 6 includes a row decoder circuit RDEC, a column decoder circuit CDEC, a column switch circuit CSW, and data lines DL00 to DL63. Although the memory section MCA in the present example is implemented as a DRAM, it is also possible to employ a rewritable memory (e.g., an SRAM or EEPROM) for the memory section MCA.

The row decoder circuit RDEC and the column decoder circuit CDEC receive a portion of the address signal and designates memory cells of the memory array MA in accordance with that portion.

To the column switching circuit CSW, an internal date bus MD, an internal bus TMI, and a test pattern output but TMO are coupled. Furthermore, the column switching circuit CSW receives the control signal TRW and the timing signal TGMA for controlling the writing or reading of data during testing the memory array MA. The switching circuit CSW further receives a portion of the address signal.

Figure 7:
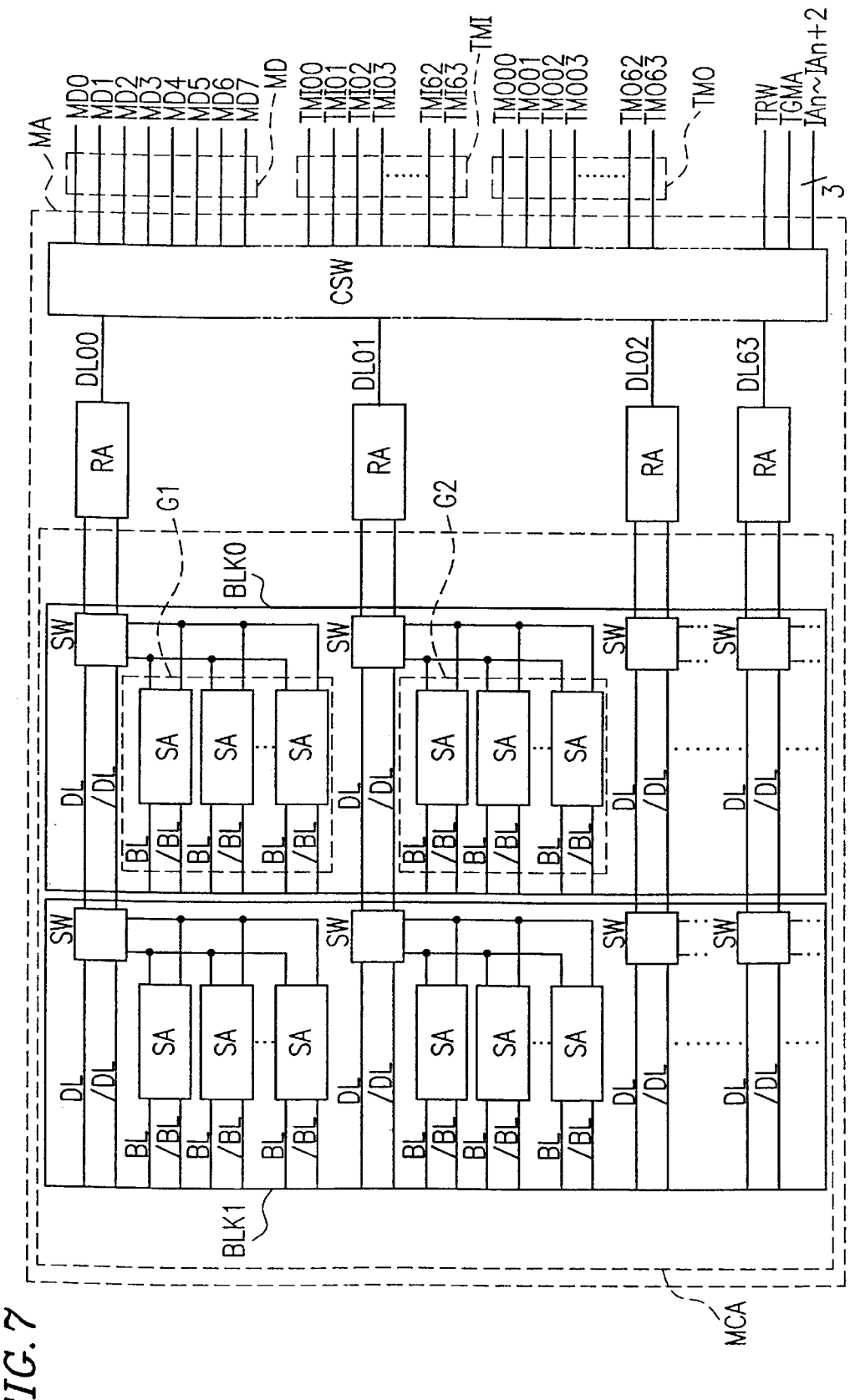
FIG. 7 shows a portion of a memory section MCA of the memory array MA shown in FIG. 6.

FIG. 7 shows a portion of the memory section MCA of the memory array MA in FIG. 6.

The memory section MCA in FIG. 7 includes a plurality of memory blocks BLK0 and BLK1, a plurality of sense amplifiers SA, a plurality of read amplifiers RA, a plurality of switches SW, a plurality of data line pairs DL and /DL, a plurality of bit line pairs BL and /BL, a plurality of memory cells (not shown), and a plurality of word lines (not shown). A potential difference between the one pair of bit lines BL and /BL, amplified by a selected sense amplifier circuit SA, is output as one bit.

In the memory block BLK0, the sense amplifiers SA and the bit line pairs BL and /BL are subdivided into 64 groups (G1 to G64, among which only G1 and G2 are illustrated for conciseness). The row decoder circuit RDEC shown in FIG. 6 activates one of the word lines (not shown). The data stored in the memory cells coupled to the activated word line is read and transferred to the bit line pairs BL and /BL. The column decoder circuit CDEC shown in FIG. 6 activates one of the sense amplifiers SA in each group (G1 to G64). The column decoder circuit CDEC also determines which switch SW should be activated in accordance with the address signal. The data which has been transferred through the activated sense amplifier SA is output to the column switching circuit CSW via the activated switch SW and read amplifiers RA.

Figure 8:
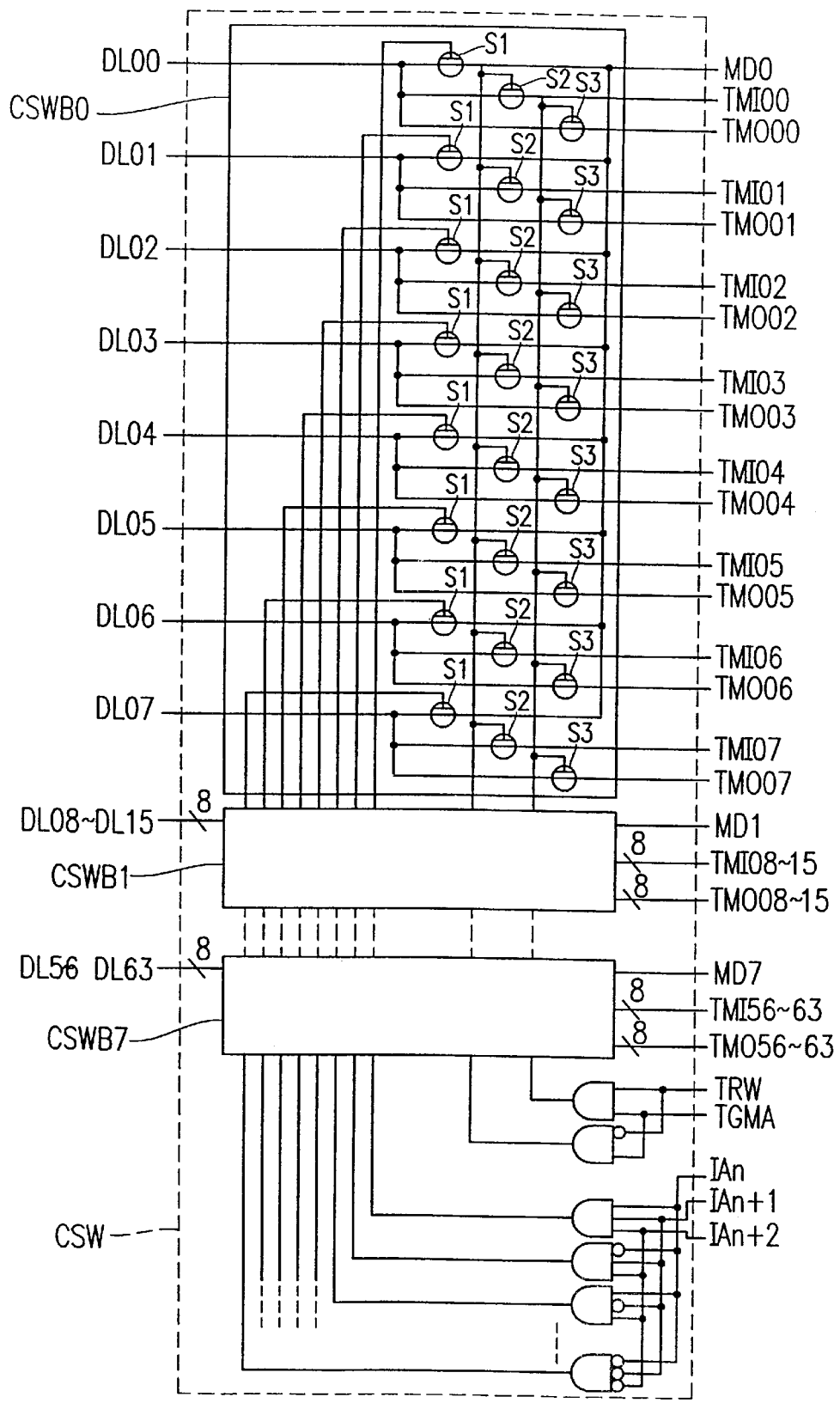
FIG. 8 shows the details of a column switching circuit CSW shown in FIGS. 6 and 7.

FIG. 8 shows the details of the column switching circuit CSW shown in FIGS. 6 and 7.

The column switching circuit CSW includes column switching blocks CSWB0 to CSWB7. The column switching blocks CSWB0 to CSWB7 each include a plurality of switches, e.g., n-MOS transistors.

The column switching circuit CSW selectively outputs the data which has been output via the data lines DL00 to DL63 to either the internal data bus MD or the test pattern output bus TMO.

In the case where the column switching circuit CSW directs the data which has been output via the data liens DL00 to DL63 to the internal data bus MD, the data which has been output via the data lines DL00 to DL63 is "thinned out" by the column switching circuit CSW based on the address signal. One of the plurality of switches S1 in each of the column switching blocks CSWB0 to CSWB7 is selected in accordance with the address signal ($IA_n$, $IA_{n+1}$ and $IA_{n+2}$) so as to allow the data to be output to the internal data bus MD. In this case, all of the switches S2 and S3 in each of the column switching blocks CSWB0 to CSWB7 are turned off in accordance with the timing signal TGMA. In the column switching block CSWB0, for example, if the switch S1 coupled to the data line DL00 is selected, the data which has been output via the data line DL00 is sent to the internal bus MD0.

In the case where the column switching circuit CSW directs the data which has been output via the data lines DL00 to DL63 to the test pattern output bus TM0, all of the data is output to the test pattern output bus TM0 via the switches S3 in the column switching blocks CSWB0 to CSWB7. In this case, all of the switches S3 in each of the column switching blocks CSWB0 to CSWB7 are turned on in accordance with the control signal TRW (which instructs that a test pattern be read) and the timing signal TGMA, whereas all of the switches S2 in each of the column switching blocks CSWB0 to CSWB7 are turned off in accordance with the control signal TRW.

Furthermore, the column switching circuit CSW directs the data which has been output via the internal data bus MD or the internal bus TMI to the memory section MCA via some or all (respectively) of the data lines DL00 to DL63.

In the case where the data which has been output via the internal data bus MD is directed to the memory section MCA via some of the data lines DL00 to DL63, one of the switches S1 in each of the column switching blocks CSWB0 to CSWB7 is selected in accordance with the address signal ($IA_n$, $IA_{n+1}$, and $IA_{n+2}$). In this case, all of the switches S2 and S3 in each of the column switching blocks CSWB0 to CSWB7 are turned off in accordance with the timing signal TGMA. In the column switching block CSWB0, for example, if the switch S1 coupled to the data line DL00 is selected, the data which has been output via the internal bus MD0 is sent to the memory section MCA via the data line DL00.

In the case where the data which has been output via the internal bus TMI is directed to the memory section MCA via all of the data lines DL00 to DL63, all of the switches S2 in each of the column switching blocks CSWB0 to CSWB7 are selected. In this case, all of the switches S2 in each of the column switching blocks CSWB0 to CSWB7 are turned on in accordance with the control signal TRW (which instructs that a test pattern be written) and the timing signal TGMA, whereas all of the switches S3 in each of the column switching blocks CSWB0 to CSWB7 are turned off in accordance with the control signal TRW. In the column switching block CSWB0, for example, the switches S2 coupled to the data lines DL00 to DL07 are selected, the data which has been output via the internal buses TMI00 to TMI07 is sent to the memory section MCA via the data lines DL00 to DL07.

Hereinafter, the structure of the comparison circuit COMP will be described with reference to FIG. 9.

Figure 9:
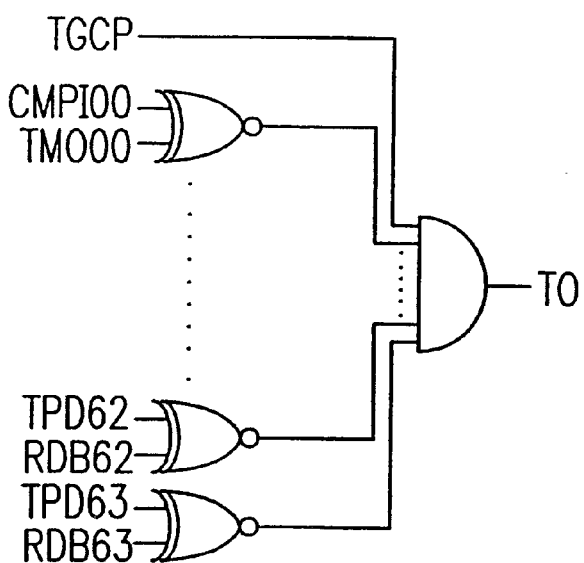
FIG. 9 illustrates a comparison circuit COMP.

FIG. 9 illustrates the comparison circuit COMP. The comparison circuit COMP includes 64 exclusive logic NOR circuits EX-NOR and an AND circuit AND having 65 inputs.

Each exclusive logic OR circuit EX-NOR receives a 64 bit test pattern which has been read from the memory array MA and a 64 bit test pattern which has been transferred from the test pattern generation circuit PAM via the output switching circuit PSW. If the two test patterns do not coincide with each other (even with respect to 1 bit), an "L" level signal is output to the output terminal TO from the AND circuit AND; if the two test patterns completely (i.e., with respect to all bits) coincide with each other, and "H" level signal is output to the output terminal TO from the AND circuit AND.

The AND circuit AND is opened or closed responsive to the control signal TGCP for the comparison circuit COMP, which is generated by the timing generation circuit RTG.

Hereinafter, an exemplary timing scheme for the operation of the semiconductor memory device 200 (FIG. 2) in the test mode will be described.

Figure 10:
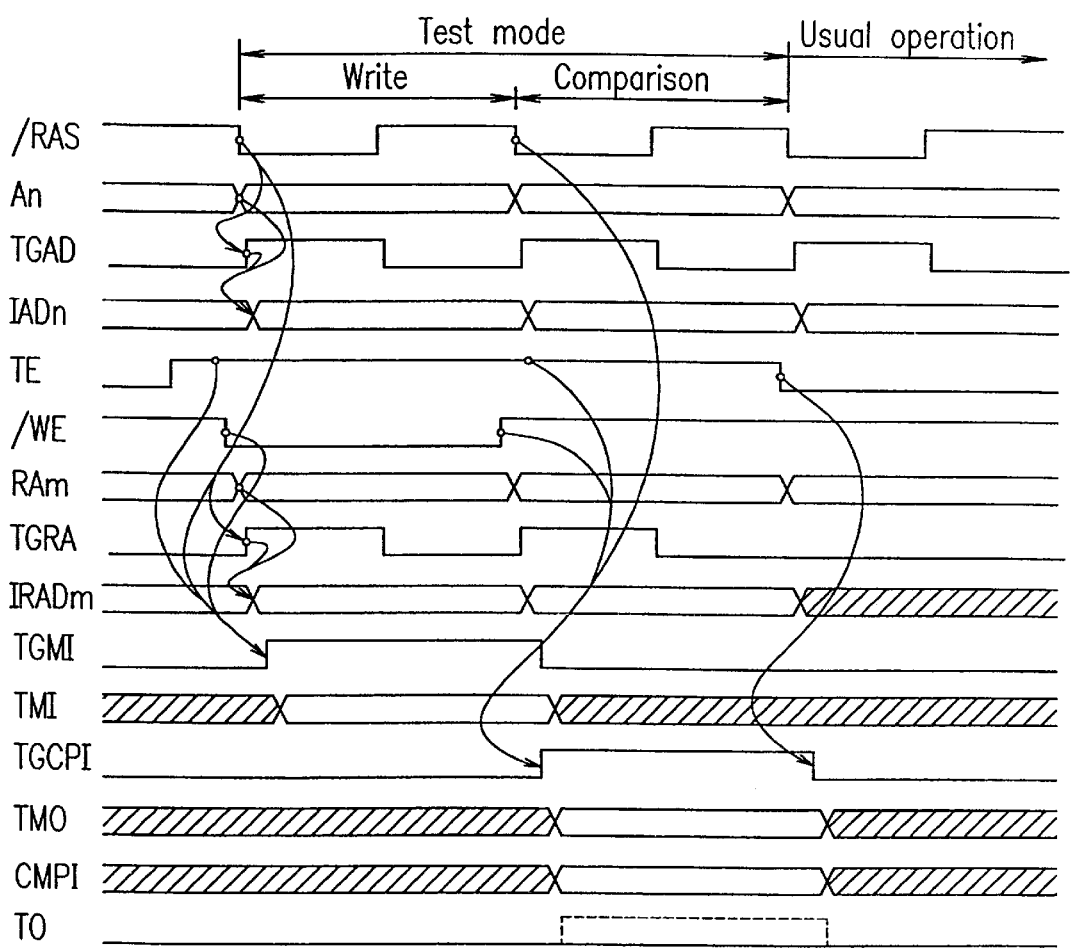
FIG. 10 is a timing diagram illustrating the operation of the semiconductor memory device 200 shown in FIG. 2 in its test mode.

FIG. 10 is a timing diagram illustrating the operation of the semiconductor memory device 200 shown in FIG. 2 in its test mode.

The test mode operation includes 2 cycles: a cycle (write cycle) during which a test pattern is written to the memory array MA, and a cycle (comparison cycle) during which the data which is stored in the memory array MA so as to be compared against a test pattern from the test pattern generation circuit PAM.

The test mode is entered in synchronization with a rising edge of the test enable signal TE. Alternatively, any other signal may be employed that is capable of placing the semiconductor memory device 200 in the test mode; it is not mandatory to utilize a rising edge of the signal, either.

Once the test mode is entered, a test pattern is written to the memory array MA. The timing generation circuit TG causes the control signal TGAD to rise at a falling edge of the row address strobe signal /RAS. The address input circuit ADB fetches the address signal. ($A_1$ to $A_n$) at the rising edge of the control signal TGAD. Optionally, the address input circuit ADB may convert the address signal ($A_1$ to $A_n$) into internal address signal ($IAD_1$ to $IAD_n$). The address input circuit ADB begins access to the memory cells of the memory array MA based on the address signal ($A_1$ to $A_n$) or the internal address signal ($IAD_1$ to $IAD_n$).

An address signal designating an address in the memory array MA is fetched in synchronization with the control signal TGAD generated by the timing generation circuit TG. In the timing diagram shown in FIG. 10, the timing generation circuit TG is illustrated to generate the control signal TGAD in accordance with the row address strobe signal /RAS. Alternatively, the timing generation circuit TG may generate the control signal TGAD in accordance with the column address strobe signal /CAS.

In the test mode, the timing generation circuit TGR causes the control signal TGRA to rise at a falling edge of the row address strobe signal /RAS so as to fetch an address designating a test pattern within the test pattern generation circuit PAM as well as the above-mentioned address for the memory array MA. As a result, an address signal ($RA_1$ to $RA_n$) for a test pattern is fetched by the address input circuit RADB. The address input circuit RADB may convert the address signal ($RA_1$ to $RA_n$) into an internal address signal $IRAD_1$ to $IRAd_n$. A test pattern designated by the address signal ($RA_1$ to $RA_n$) or the internal address signal ($IRAD_1$ to $IRAD_n$) is read from the test pattern generation circuit PAM.

While the control signal TGMI is at the "H" level, the output switching circuit PSW transfers the test pattern from the test pattern generation circuit PAM to the memory array MA via the internal bus TMI. The memory array MA stores this test pattern in the memory cells which are designated by the address signal ($A_1$ to $A_n$) or the internal address signal ($IAD_1$ to $IAD_n$).

The control signal TGMI, which controls writing of a test pattern, is generated by the timing generation circuit TGR responsive to the falling edge of the row address strobe signal /RAS and the write enable signal /WE under the condition that the test enable signal TE is at the "H" level (indicating that the test mode is entered).

The timing generation circuit TG causes the control signal TAGD to rise at a falling edge of the row address strobe signal /RAS. The address input circuit ADS fetches the address signal ($A_1$ to $A_n$) responsive to the rising edge of control signal TGAD. The address input circuit ADB may convert the address signal ($A_1$ to $A_n$) into an internal address signal ($IAD_1$ to $IAD_n$). The memory cells of the memory array MA are enclosed based on the address signal ($A_1$ to $A_n$) or the internal address signal ($IAD_1$ to $IAD_n$). Thus, the test pattern which is stored in the memory array MA is read and transferred to the comparison circuit COMP.

On the other hand, the timing generation circuit TGR causes the control signal TGRA to rise at a falling edge of the row address strobe signal /RAS.

The address input circuit RADB fetches the address signal ($RA_1$ to $RA_n$) responsive to the rising edge of the control signal TGRA. The address input circuit RADB may convert the address signal ($RA_1$ to $RA_n$) into the internal address signal ($IRAD_1$ to $IRAD_n$). A test pattern designated by the address signal ($RA_1$ to $RA_n$) or the internal address signal ($IRAD_1$ to $IRAD_n$) is read from the test pattern generation circuit PAM so as to be transferred to the output switching circuit PSW.

While the control signal TGCPI is at the "H" level, the output switching circuit PSW transfers the test pattern from the test pattern generation circuit PAM to the comparison circuit COMP.

The control signal TGCPI, which controls the timing with which test patterns are compared, is generated by the timing generation circuit TGR responsiveness to a falling edge of the row address strobe signal /RAS under the condition that the test enable signal TE is at the "H" level and that the write signal /WE is at the "H" level.

The control signal TGCPI and the control signal TGMI mentioned above may be generated by any other method that enables writing and comparison of test patterns during the test mode.

Responsive to the control signal TGCP, the comparison circuit COMP compares the test pattern which has been read from the memory array MA against the test pattern which has been output from the test pattern generation circuit PAM via the output switching circuit PSW. If the two test patterns coincide with each other, an "H" level signal is output to the output terminal TO; if the two test patterns do not coincide with each other, an "L" level signal is output to the output terminal TO. The semiconductor memory device 200 is regarded as passing the test when the output terminal TO is at the "H" level. The semiconductor memory device 200 is regarded as failing the test when the output terminal TO is at the "L" level.

The semiconductor memory device 200 according to the present example is constructed on one chip, within which a test pattern can be generated and stored in the memory array MA. The test pattern which has been generated by the test pattern generation circuit PAM is compared against the test pattern which has been read from the memory array MA. As a result, it is possible to accurately detect whether a plurality of memory cells in the memory array MA are satisfactory or defective.

The test pattern generation circuit PAM can include a plurality of test patterns (corresponding to a plurality of address signals) recorded therein so as to output a different test pattern depending on the address signal. As a result, a memory block can be subjected to a number of different tests.

EXAMPLE 3

Hereinafter, a semiconductor memory device 300 according to Example 3 of the present invention will be described with reference to FIGS. 11 and 12. Those elements of the semiconductor memory device 300 which also appear in the semiconductor memory device 200 are denoted by the same reference numerals as used therein, and the description thereof is omitted.

Figure 11:
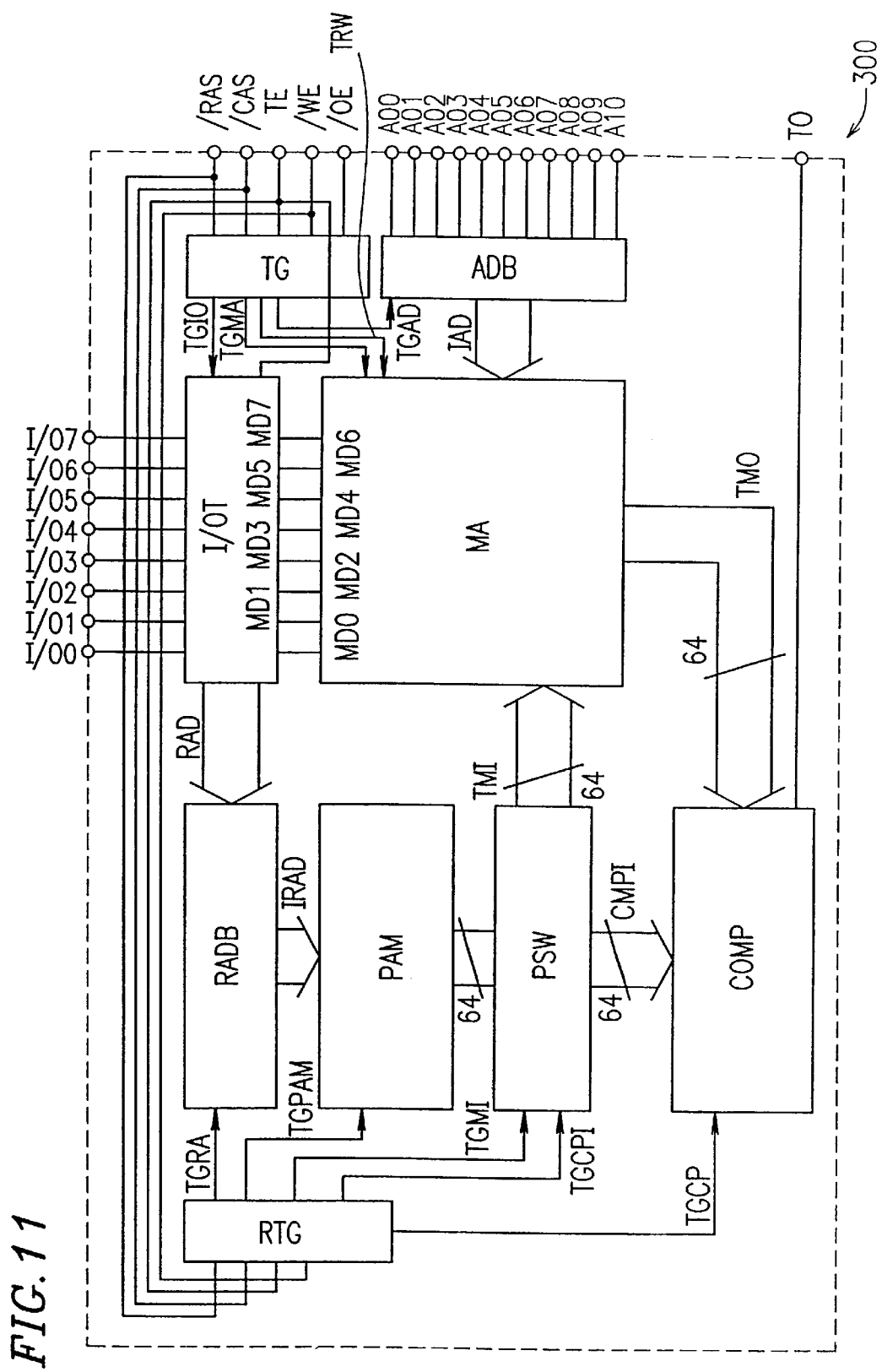
FIG. 11 is a block diagram illustrating a semiconductor memory device 300 according to Example 3 of the present invention.

FIG. 11 is a block diagram illustrating the semiconductor memory device 300 of the present example.

In the semiconductor memory device 300, the address terminals RAO0 to RAO7 for the test pattern generation circuit PAM in the semiconductor memory device 200 are omitted. Instead, the input/output terminals I/O0 to I/O7 of the semiconductor memory device 300 are shared by both the memory array MA and the test pattern generation circuit PAM. Accordingly, the input/output circuit I/O of the semiconductor memory device 300 is further modified from the input/output circuit I/O of the semiconductor memory device 200 so as to accommodate this difference.

The data input/output terminals I/O0 to I/O7 of the semiconductor memory device 200 are not employed in the test mode. Therefore, the data input/output terminals I/O0 to I/O7 can be utilized for inputting an address signal to the test pattern generation circuit PAM in the test mode. As a result, the semiconductor memory device 300 is capable of inputting an address signal to the test pattern generation circuit PAM without incorporating the address terminals RAO0 to RAO7.

Figure 12:
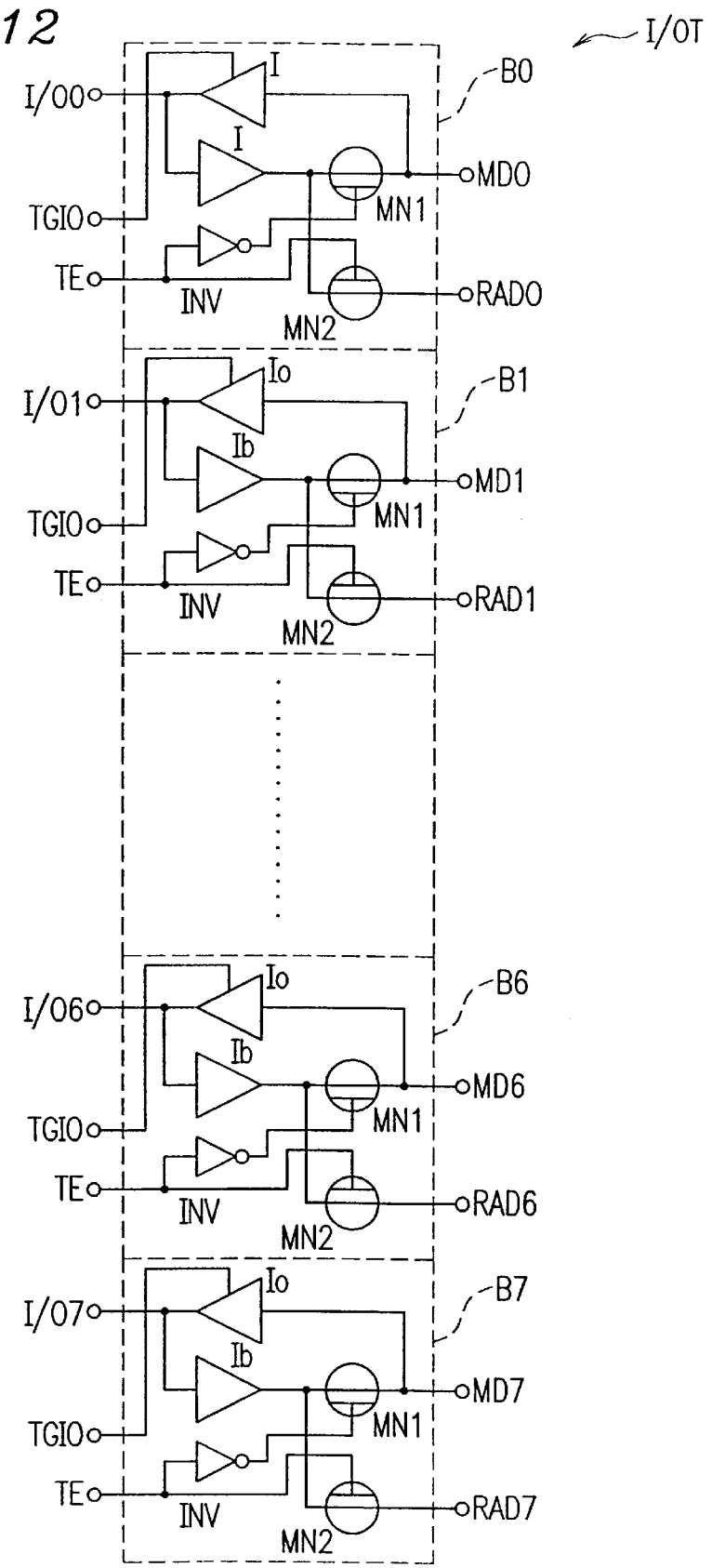
FIG. 12 illustrates an input/output circuit I/OT shown in FIG. 11 in more detail.

FIG. 12 illustrates the input/output circuit I/OT shown in FIG. 11 in more detail.

The input-output circuit I/OT includes input/output blocks B0 to B7. Each of the input/output blocks B0 to B7 includes an input buffer circuit Ib, an output buffer circuit Io, an invertor circuit INV, and n-MOS transistors MN1 and MN2.

The input/output circuit I/OT is controlled in accordance with the control signal TGIO and/or the test enable signal TE. During usual operation (i.e., while not in the test mode), the input/output I/OT functions as a data input/output circuit so as to exchange data between itself and the memory array MA via the internal data bus MD. In the test mode, the input/output circuit I/OT outputs the received data, i.e., an address signal, to the address input circuit RADB via the internal bus RAD.

The output buffer circuit Io is controlled in accordance with the control signal TGIO. when data is output to the memory array MA and when an address signal is output to the test pattern generation circuit PAM, the output buffer Io increases the impedance of the output side of the output buffer Io responsive to the control signal TGIO. As a result, the data or the address signal is prevented from flowing back to the input/output terminals I/O0 to I/O7.

During usual operation, the test enable signal TE is at the "L" level, causing the transistor MN1 to be turned on. As a result, the data from the memory array MA, for example, may be transferred to the input/output terminal I/O0 responsive to the control signal TGIO. Data may also be transferred in an opposite flow responsive to the test enable signal TE and the control signal TGIO.

In the test mode, the test enable signal TE is at the "H" level, causing the transistor MN2 to be turned on. As a result, the address signal from the input/output terminal I/O0, for example, may be transferred to the address input circuit RADB.

The present invention provides no limitation to the specific circuit structure or control signals as long as the aforementioned operations can be achieved.

Although the input/output terminalos I/O0 to I/O7 of the memory array MA are shared by both the memory array MA and the test pattern generation circuit PAM so that the memory array MA or the test pattern generation circuit PAM can receive data or an address signal, it is also applicable to construct the semiconductor memory device 300 so that a portion of the address terminals AO0 to A10 are shared by the memory array MA and the test pattern generation circuit PAM.

An address signal to be received by the test pattern generation circuit PAM may be input by utilizing all of the address terminals AO0 to A10 of the memory array MA. In this case, the bit number of the address for accessing the test pattern generation circuit PAM is increased, thereby making it possible to apply an increased number of test patterns to the memory array MA without incorporating additional terminals.

Since the terminals which are utilized in the test mode are also utilized as terminals for use in usual operation, no additional terminals are required for inputting an address signal to the test pattern generation circuit PAM from outside the chip.

EXAMPLE 4

Hereinafter, a semiconductor memory device 400 according to Example 4 of the present invention will be described with reference to FIGS. 13 and 14. As in Example 3, the present example provides the advantage of reducing the number of terminals.

Those elements of the semiconductor memory device 400 which also appear in the semiconductor memory device 200 are denoted by the same reference numerals as used therein, and the description thereof is omitted.

Figure 13:
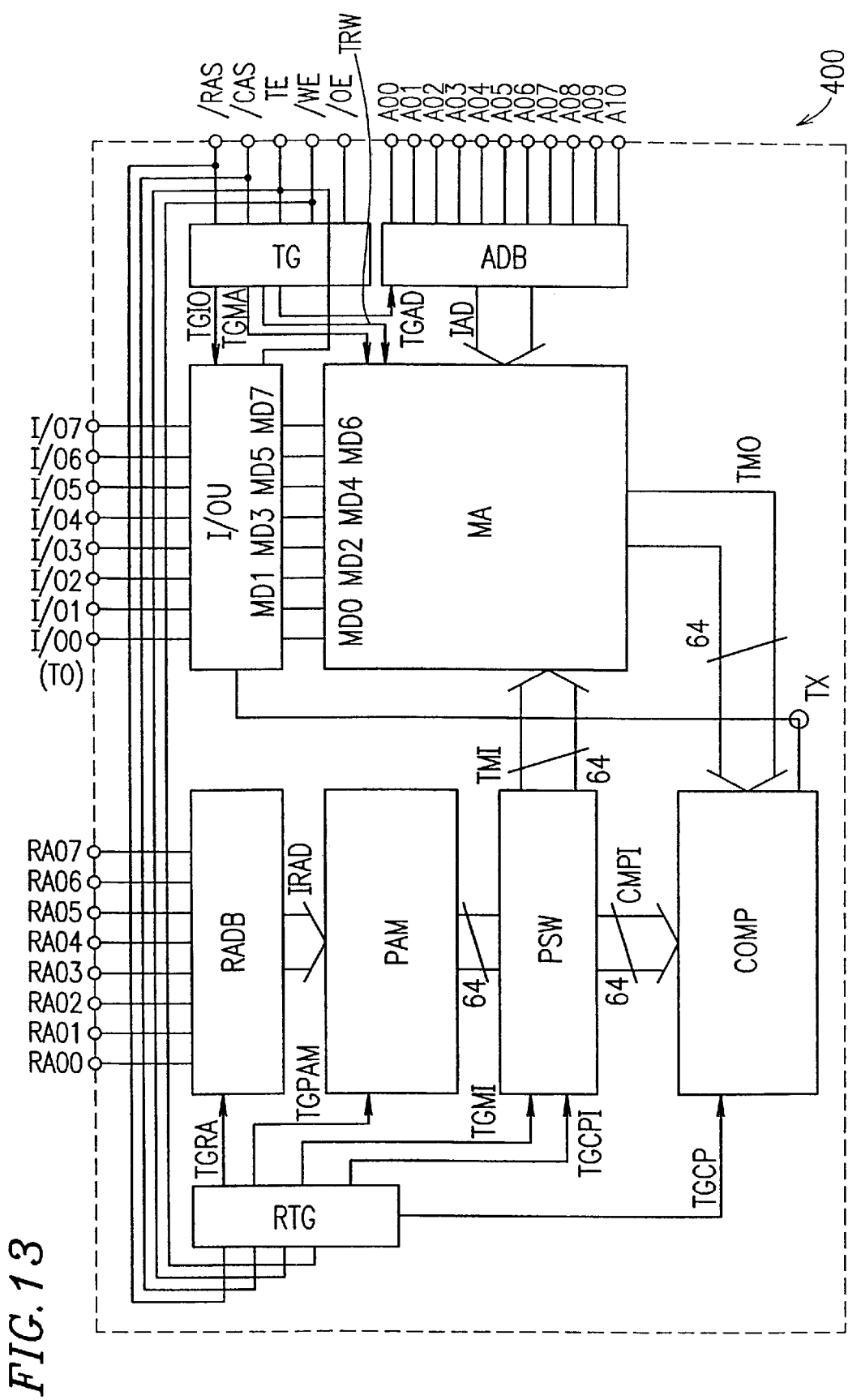
FIG. 13 is a block diagram illustrating the semiconductor memory device 400 according to Example 4 of the present invention.

FIG. 13 is a block diagram illustrating the semiconductor memory device 400 of the present example.

The semiconductor memory device 400 does not include the output terminal TO (i.e., an output terminal for outputting test results) as a separate terminal as in the semiconductor memory device 200. Instead, one of the terminals of the semiconductor memory device 400, e.g., one of the input/output terminals I/O0 to I/O7 of the memory array MA, doubles as an output terminal (TO).

Figure 14:
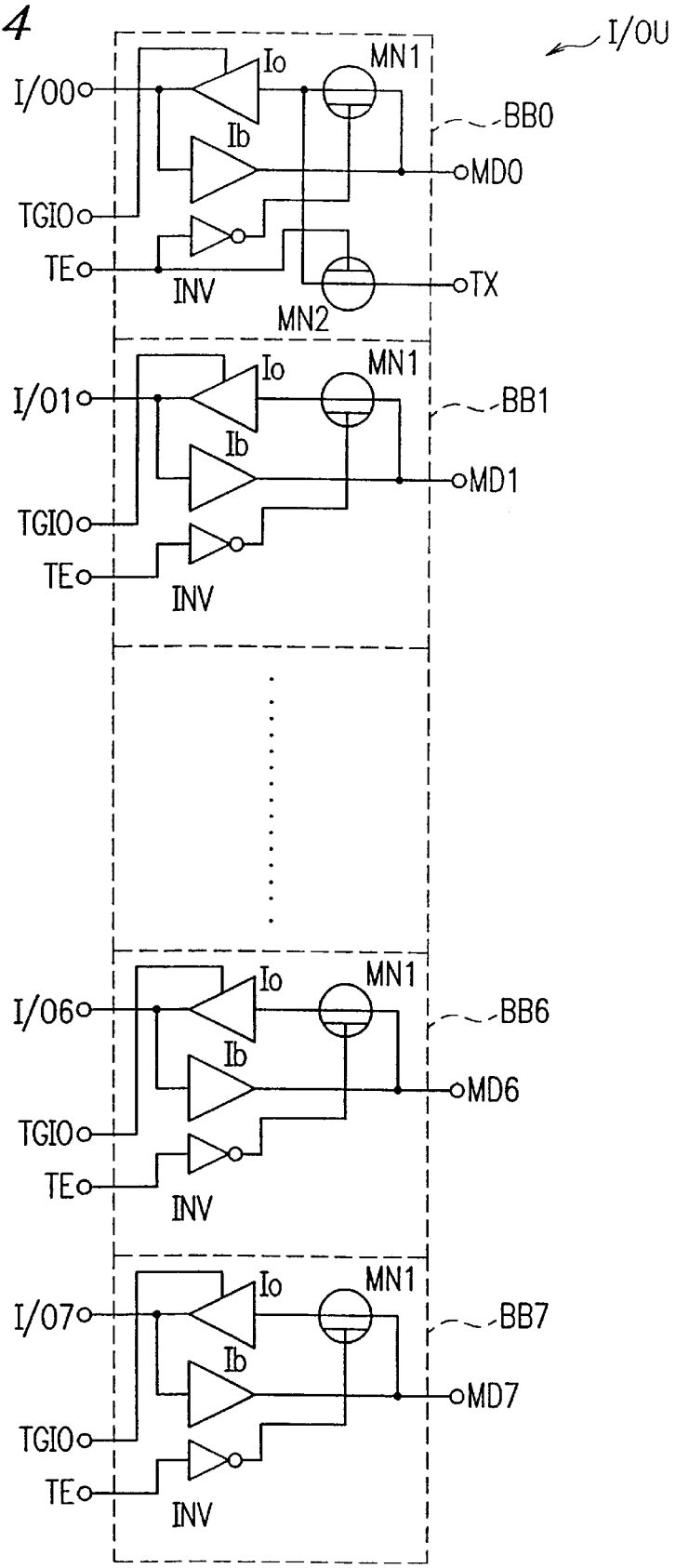
FIG. 14 illustrates an input/output circuit I/OU of the semiconductor memory device 400 shown in FIG. 13.

FIG. 14 illustrates the input/output circuit I/OU of the semiconductor memory device 400.

The input/output circuit I/OU includes input/output blocks BB0 to BB7. For example, the input/output terminal I/O0 may double as the output terminal TO as shown.

In this exemplary case, the input/output block BB0 includes an input buffer circuit Ib, an output buffer circuit Io, an invertor circuit INV, and n-MOS transistors MN1 and MN2. Each of the input/output blocks BB1 to BB7 includes an input buffer circuit Ib, an output buffer circuit Io, an invertor circuit INV, and an n-MOS transistor MN1.

As in the input/output block B0 shown in FIG. 12, the input/output block BB0 switches between the usual operation and the test mode in accordance with the test enable signal TE.

When the output buffer Io outputs data to the memory array MA, the input/output block BB0 increases the impedance of the output side of the output buffer Io responsive to the control signal TGIO.

During usual operation, the test enable signal TE is at the "L" level, causing the transistor MN1 to be turned on. As a result, the data from the memory array MA, for example, may be transferred to the input/output terminal I/O0 responsive to the control signal TGIO. Data may also be transferred in an opposite flow responsive to the control signal TGIO.

In the test mode, the test enable signal TE is at the "H" level, causing the transistor MN2 to be turned on. As a result, the signal from the comparison circuit COMP is transferred to the input/output terminal I/O0.

The principle according to the present example may be employed in combination with that of Example 3.

Since the terminals which are utilized in the test mode are also utilized as terminals for use in usual operation, no additional output terminals are required for outputting a signal indicating the test results from the comparison circuit COMP.

Thus, in the semiconductor memory device according to one embodiment of the present invention, first bus lines for coupling a memory block to a test pattern generation circuit have a larger bus width than that of second bus lines for coupling the memory block and the exterior of the semiconductor memory device. As a result, in accordance with the semiconductor memory device of the present invention, a test pattern can be written to a memory block fester via the first bus lines than writing an externally-supplied test pattern to the memory block via the second bus lines.

The semiconductor memory device according to a second embodiment of the present invention includes a comparison circuit. A test pattern which has been generated by a test pattern generation circuit is once stored in and then read from a memory block. Then, the comparison circuit compares the test pattern which has been read from the memory block against a test pattern which has been generated by the test pattern generation circuit. As a result, it is possible to accurately detect whether a plurality of memory cells included in the memory block are satisfactory or defective.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
    a memory block including a plurality of cells;
    a test pattern generation circuit for generating at least one test pattern for use in testing the memory block;
    a first bus line coupled to the memory block and a second bus line for coupling the memory block to the exterior of the semiconductor memory device, the first bus line having a large width than that of the second bus line;
    a comparison circuit for comparing a test pattern which is read from the memory block against a test pattern which is generated by the test pattern generation circuit;
    a switching circuit for selectively outputting the test pattern which is generated by the test pattern generation circuit to the memory block via the first bus line in order to be stored in the memory block, and for selectively outputting the test pattern which is generated by the test pattern generation circuit to the comparison circuit via a third bus line in order that the comparison circuit may compare the test pattern stored in the memory block with the test pattern selectively output to the comparison circuit from the test pattern generation circuit.

2. A semiconductor memory device according to claim 1, wherein the test pattern generation circuit comprises a storage section for storing a plurality of test patterns, and
    wherein one of the plurality of test patterns is output in accordance with an address signal received by the test pattern generation circuit.

3. A semiconductor memory device according to claim 1, wherein the semiconductor memory device comprises a plurality of terminals for inputting data to and outputting data from the memory block, and
    wherein the test pattern generation circuit generates a plurality of test patterns in accordance with the address signal received by the test pattern generation circuit, the address signal being received via the plurality of terminals.

4. A semiconductor memory device according to claim 1, wherein the semiconductor memory device comprises a plurality of terminals for inputting data to or outputting data from the memory block, and
    wherein at least one of the plurality of terminals outputs a result by the comparison circuit by comparing the test pattern which is read from the memory block against the test pattern which is generated by the test pattern generation circuit.

5. A semiconductor memory device according to claim 1, wherein:
    the semiconductor memory device includes a plurality of terminals for inputting data to and outputting data from the memory block,
    the test pattern generation circuit comprises a storage section for storing a plurality of test patterns,
    the tests pattern generation circuit generates the at least one test pattern from among the plurality of test patterns in accordance with an address signal received by the test pattern generation circuit, the address signal being received via the plurality of terminals, and
    at least one of the plurality of terminals outputs a result by the comparison circuit comparing the test pattern which is read from the memory block against the test pattern which is generated by the test pattern generation circuit.

* * * * *